United States Patent

Axelrod

[15] 3,675,316

[45] July 11, 1972

[54] GROUP III-V SCHOTTKY BARRIER DIODES

[72] Inventor: Norman Nathan Axelrod, Summit, N.J.

[73] Assignee: Bell Telephone Laboratories, Incorporated, Murray Hill, N.J.

[22] Filed: Feb. 1, 1971

[21] Appl. No.: 111,307

[52] U.S. Cl. ....................29/576, 317/234, 317/235

[51] Int. Cl. ....................B01j 17/00, H01l 7/00

[58] Field of Search ....................317/234 UA, 237

[56] References Cited

UNITED STATES PATENTS

| | | | |
|---|---|---|---|
| 3,089,794 | 5/1963 | Marinace | 148/1.5 |
| 3,365,630 | 1/1968 | Logan et al. | 317/237 |
| 3,451,912 | 6/1969 | D'Heurle et al. | 204/192 |

OTHER PUBLICATIONS

IBM Technical Disclosure Bulletin (an artile entitled: " Fabricating Field Effect Transistors," H. Statz) Vol. 11, No. 4, Sept. 1968

*Primary Examiner*—James D. Kallam
*Attorney*—R. J. Guenther and Edwin B. Cave

[57] ABSTRACT

A thin layer, with a relatively low active donor concentration (e.g. $<5 \times 10^{17}$ per $cm^3$), is produced in a slice of a Group III–V semiconductor material doped, with a Group VI dopant to a relatively high active donor concentration (e.g. $>10^{18}$ per cm) by maintaining the slice in a nonreacting atmosphere at an elevated temperature. The temperature is such that the equilibrium vapor pressure of the Group III constituent is greater than the equilibrium vapor pressure of the Group V constituent. Such materials are used, for example, in the fabrication of mm-wave Schottky barrier mixer diodes.

10 Claims, 2 Drawing Figures

INVENTOR
N. N. AXELROD
BY George S. Indig
ATTORNEY

GROUP III-V SCHOTTKY BARRIER DIODES

BACKGROUND OF THE INVENTION

1. Field of the Invention

The invention is a semiconductor processing technique.

2. Brief Description of the Prior Art

Schottky barrier diodes are especially well suited for high frequency varistor and varactor use partly because of the virtual absence of minority carrier injunction from the metal contact into the semiconductor. This results in the absence of the minority carrier diffusion capacitance or charge storage capacitance which limits the capabilities of p-n junction devices in the mm-wave range (above 30 GHz).

For such high frequency application both low capacitance and low series resistances are desired. For instance, for a Schottky barrier varistor, the forward biased cutoff frequency, $f_{cf}$, is given by the relationship $f_{cf} = 1/(2\pi C_{bf} R_{sf})$, where $C_{bf}$ and $R_{sf}$ are the forward bias capacitance and series resistance. In addition any series resistance is a noise source which degrades the low level device performance. The low capacitance requirement can be met by the use of lightly doped semiconductor materials which produce a wide depletion region. However, the use of such materials leads to large series resistances.

This problem of incompatible requirements has been successfully met, at least at lower frequencies than here considered, by the application of a thin epitaxial layer of lightly doped material on a heavily doped substrate. A number of epitaxial deposition techniques both from the liquid and vapor phase are known in the literature. However, as the frequency of device use is increased the required thickness of epitaxial layer is reduced resulting in uniformity problems as the epitaxial layer becomes less than of the order of 1 $\mu$m in thickness. In addition, a number of surface effects have been noticed during such processing (J. S. Harris et al. Journal of Applied Physics, 40 [1969] page 45–75) which tend to degrade device performance.

SUMMARY OF THE INVENTION

It has been found that a thin layer (between 0.05 and 1 $\mu$m) with a relatively low concentration of active donors can be produced on a relatively heavily doped wafer of a Group III–V semiconductor material containing a Group VI donor dopant (most commonly S, Se or Te) by a simple heating step. During this step the sample is in an inert atmosphere and the temperature of the sample is held below the congruent evaporation temperature $T_c$. Below $T_c$ the vapor pressure of the Group III constituent is greater than the vapor pressure of the Group V constituent so that there is a net evaporation of Group III constituent atoms from the sample surface and no accumulation of liquid on the surface. After allowing the resulting Group III vacancies to diffuse into the sample a decrease in the concentration of active donors is observed. In this manner, for example, gallium arsenide with a tellurium doping of $3.5 \times 10^{18}$ per cubic cm has been produced with a surface layer of the order of 0.1 $\mu$m thick containing an average active donor concentration of $5 \times 10^{17}$ per cubic cm. This material is suitable for Schottky barrier varistor diodes in the millimeter wave frequency range (above 30 GHz).

The simplicity of this treatment, as opposed to the various deposition procedures, combines with the simplicity of the Schottky diode itself to make such diodes especially attractive in the millimeter wave range of frequency. In this frequency range, where the diodes must be of the order of 2–3 $\mu$m in diameter, the elimination of processing steps is much to be desired.

DETAILED DESCRIPTION OF THE INVENTION

Figure 1:
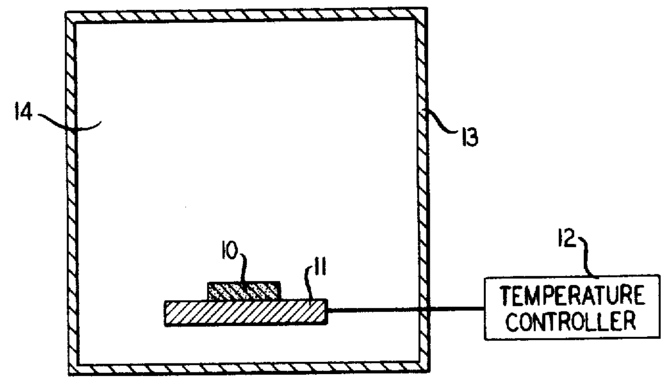
FIG. 1 is a plan view in cross section of an exemplary processing apparatus.

FIG. 1 shows an apparatus in which a wafer of a Group III–V semiconductor material containing a Group VI donor dopant is being treated in accordance with the invention. The wafer 10 is in contact with a heating plate 11 whose temperature is controlled by the temperature controller 12. This heating plate 11 is merely illustrative of the many devices known to the art which may be used to maintain the wafer 10 at the desired temperature, such devices including ovens and radiant heaters. The wafer 10 and heater 11 are situated within a chamber 13 within which nonreactive ambient 14 is maintained. The inventive procedure for the production of a thin surface layer with a reduced active donor concentration consist, essentially, of maintaining the wafer for a preselected time at an elevated temperature which is less than the congruent evaporation temperature, $T_c$, for the wafer material. $T_c$ is the temperature below which the vapor pressure of the Group III constituent is greater than the vapor pressure of the Group V constituent. All III–V semiconducting compounds possess such a congruent evaporation temperature. $T_c$ has been measured directly for several such compounds and deduced from related measurements for others (C. D. Thurmond, Journal of the Physics and Chemistry of Solids, 20 [1965] page 785; J. R. Arthur, Journal of the Physics and Chemistry of Solids, 28, [1967] page 2,257; M. P. Panish et al. Journal of Chemical Thermodynamics, 2 [1970] page 299). The best measurements to date show that the approximate $T_c$ values of the following representative materials are:

GaAs $T_c = 640°$ C.

GaP $T_c = 660°$ C., and

InP $T_c = 535°$ C.

If a Group III-V semiconductor doped with a Group VI donor impurity is heated in a nonreactive ambient below its congruent evaporation temperature, the active donor concentration is lowered in a region near the surface of the solid. This phenomenon involves the evaporation of the Group III constituent from the semiconductor surface at a greater rate than the evaporation of the Group V constituent and the diffusion of the resulting Group III vacancies from the surface into the solid.

The temperature chosen for the operation of the inventive treatment depends in part on two other factors. It depends upon the rate of evaporation of material from the surface and the rate of diffusion of vacancies into the solid. The temperature must be high enough so that it is not necessary to wait an inordinately long time to produce the desired active donor reduction and high enough so that the vacancies can diffuse to the desired depth below the surface. These considerations dictate that the treatment temperature be within 100° of $T_c$ with the best results, for most purposes obtaining within 60° of $T_c$.

The evaporation rate and diffusion rate vary according to laws known in the art so that the temperature can be used to vary one rate with respect to the other. Another variable which can be used to vary the evaporation rate relative to the diffusion rate at any one temperature is the pressure of the nonreactive ambient 14. Increasing the pressure of the ambient will tend to reduce the evaporation rate relative to the diffusion rate, resulting in the relatively deeper diffusion of relatively fewer vacancies.

Figure 2:
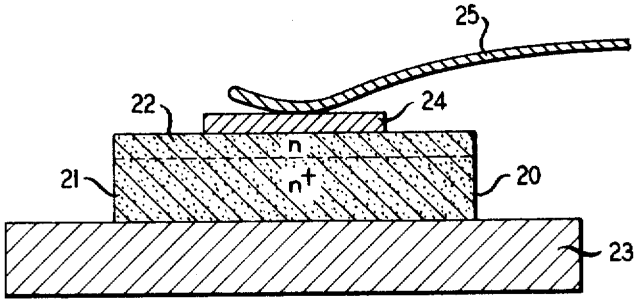
FIG. 2 is a plan view in cross section of an exemplary Schottky barrier device.

FIG. 2 shows an exemplary Schottky barrier diode produced by the disclosed process. The semiconductor wafer 20 is composed principally of a relatively heavily doped region 21 ($>10^{18}$ active donors per cubic cm) and a surface layer region 22 which is greater than 0.05 $\mu$m thick with average donor concentration of less than $5 \times 10^{17}$ active donors per cubic cm. Such a wafer 20 is known in the art as an $n$ on $n^+$ structure. The surface layer 22 does not possess in general, a uniform active donor concentration but represents a layer in which the average active donor concentration is as specified above.

To the $n^+$ region 21 there is affixed a metallic contact 23 which, by procedures well known in the art is caused to make a nonrectifying contact. To the surface layer region 22 there is affixed a metallic contact 24 which forms a Schottky barrier contact. To this second contact 24 a metallic lead 25 may be bonded in order to make connection to the external circuitry. In mm-wave circuits the contact 23 is often an integral part of circuit ground plane. Fabrication of such a device is exceedingly simple consisting, aside from the attachment of external leads, essentially of the two steps; (1) the heating of the wafer as disclosed above in order to form the surface region 22; and (2) the evaporation of the contact 24 which defines the Schottky barrier diode. In the millimeter wave frequency range, where this contact 24 must be of the order of 2 to 3 $\mu m$ in diameter, this simplicity is exceedingly desirable. Such Schottky barrier devices possess many advantages well known in the art for both varistor (forward bias) and varactor (reverse bias) usage.

Examples

In one series of measurements, the wafers were tellurium doped gallium arsenide with an active donor concentration of $3.5 \times 10^{18}$ per cubic cm. They were cut parallel to a 110 plane. They were cleaned by standard cleaning methods including an etch in a 0.05 percent bromine in methylalchol solution. The wafers were clamped against an internally heated molybdenum block and placed in a chamber which was then evacuated lower than $10^{-4}$ torr. to form a nonreactive ambient. The wafers were then raised to the heat treatment temperature and kept at this temperature for times variously 15 and 60 minutes. The temperatures used varied between 500° and 600° C.

The wafers were prepared for evaluation, subsequent to treatment, by evaporating 0.01 inch diameter and 0.02 inch diameter gold electrodes onto the wafer surface exposed to vacuum and making a nonrectifying contact to the face of the wafer in contact with the heated block. Each of the diodes thus formed was used to measure the zero bias depletion depth (indicative of the thickness of the surface layer) and the concentration of active donors as a function of depth in the wafer. These measurements showed that the desired results (a layer between 0.05 $\mu m$ and 1 $\mu m$ thick containing less than $5 \times 10^{17}$ active donors per cubic cm) were obtained for times greater than 15 minutes and temperatures greater than 550° C. The 600°-60 minute treatments were most effective. In GaAs the Group VI donor dopant which behaves most nearly like Te is Se.

What is claimed is:

1. A method for the production of a semi-conducting device comprising;

treating an n-type Group III-V compound semiconducting body consisting essentially of a Group III constituent and a Group V constituent and contains a Group VI donor dopant in a concentration greater than $10^{18}$ active donors per cubic centimeter through at least a major portion of the body;

and affixing at least one first metallic contact to the body in nonrectifying contact, characterized in that the method comprises;

raising the body to an elevated temperature which is less than the congruent evaporation temperature for a period of time, wherein the equilibrium vapor pressure of the Group III constituent is greater than the equilibrium vapor pressure of the Group V constituent, while maintaining the body in a nonreactive ambient for producing an n-type surface layer region greater than 0.05 $\mu m$ thick with an average active donor concentration of less than $5 \times 10^{17}$ active donors per cubic centimeter; and affixing at least one second metallic contact to the surface layer region in a Schottky barrier contact.

2. A method of claim 1 in which the semiconducting body consists essentially of at least one member selected from the group consisting of GaAs, GaP and InP.

3. A method of claim 2 in which the semiconducting body consists essentially of GaAs.

4. A method of claim 3 in which the Group VI donor is one member selected from the group consisting of Se and Te.

5. A method of claim 4 in which the Group VI donor is Te.

6. A method of claim 3 in which the temperature is less than 640° C. but greater than 550° C.

7. A method of claim 6 in which the temperature is greater than 590° C.

8. A method of claim 1 in which the nonreacting ambient is at a pressure of less than $10^{-4}$ torr.

9. A method of claim 1 in which the elevated temperature is not lower than 100 Centigrade degrees below the congruent evaporation temperature.

10. A method of claim 9 in which the surface layer region is less than 1 $\mu m$ thick.

* * * * *